(12) United States Patent
Medan

(10) Patent No.: US 9,729,168 B1
(45) Date of Patent: Aug. 8, 2017

(54) DECOMPRESSION OF A COMPRESSED DATA UNIT

(71) Applicant: Infinidat LTD., Herzliya (IL)

(72) Inventor: Yoav Medan, Haifa (IL)

(73) Assignee: Infinidat Ltd., Herzliya (IL)

( * ) Notice: Subject to any disclaimer, the term of this patent is extended or adjusted under 35 U.S.C. 154(b) by 0 days.

(21) Appl. No.: 15/212,241

(22) Filed: Jul. 17, 2016

(51) Int. Cl.
  *H03M 7/34* (2006.01)
  *H03M 7/30* (2006.01)
  *H03M 7/46* (2006.01)

(52) U.S. Cl.
  CPC ........... *H03M 7/3088* (2013.01); *H03M 7/46* (2013.01)

(58) Field of Classification Search
  CPC ........ H03M 7/3088; H03M 7/46; H03M 7/00; H03M 5/00; H03M 7/34; H03M 7/38
  USPC ...................................................... 341/50, 51
  See application file for complete search history.

(56) References Cited

U.S. PATENT DOCUMENTS

| | | | | |
|---|---|---|---|---|
| 4,872,009 A * | 10/1989 | Tsukiyama | ............... | H03M 7/46 341/51 |
| 5,561,421 A * | 10/1996 | Smith | ................. | H03M 7/3088 341/106 |
| 5,818,873 A * | 10/1998 | Wall | ..................... | H03M 7/3088 341/106 |
| 5,872,530 A * | 2/1999 | Domyo | ............... | H03M 7/3088 341/106 |
| 6,208,273 B1 * | 3/2001 | Dye | ......................... | H03M 7/30 341/51 |
| 6,961,011 B2 * | 11/2005 | Matthews | ........... | H03M 7/3088 341/50 |
| 7,190,284 B1 * | 3/2007 | Dye | ....................... | G06F 12/023 341/51 |
| 7,898,442 B1 * | 3/2011 | Sovik | .................. | H03M 7/3088 341/51 |
| 2002/0101367 A1 * | 8/2002 | Geiger | .................... | H03M 7/30 341/51 |
| 2004/0246152 A1 * | 12/2004 | Castelli | ................... | G06F 12/08 341/87 |
| 2015/0160876 A1 * | 6/2015 | Kataoka | .............. | H03M 7/3088 711/162 |

* cited by examiner

*Primary Examiner* — Jean B Jeanglaude
(74) *Attorney, Agent, or Firm* — Reches Patents

(57) ABSTRACT

A method that may include retrieving, by a decompression processor, a compressed data unit; wherein the compressed data unit comprises a control section and a data section; wherein the control section comprises multiple decompression instructions for a retrieval of data portions from one or more sources; wherein the one or more source comprise the data section; wherein the control section does not include any data portion; and executing, by a decompression processor, the multiple decompression instructions to provide a decompressed data unit.

17 Claims, 18 Drawing Sheets

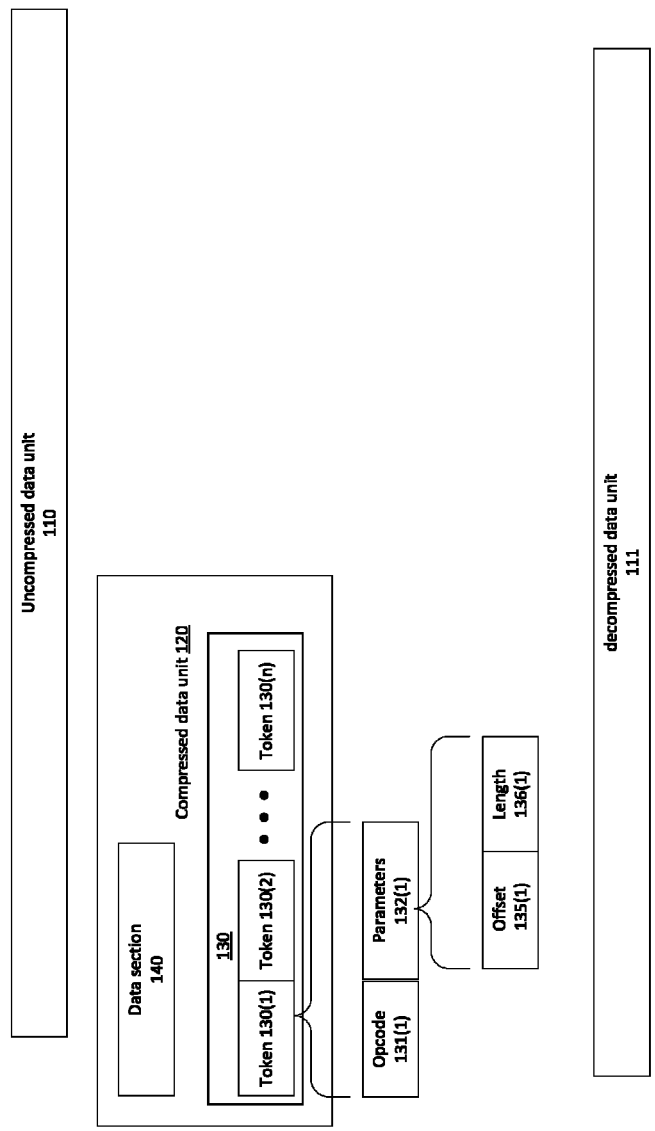

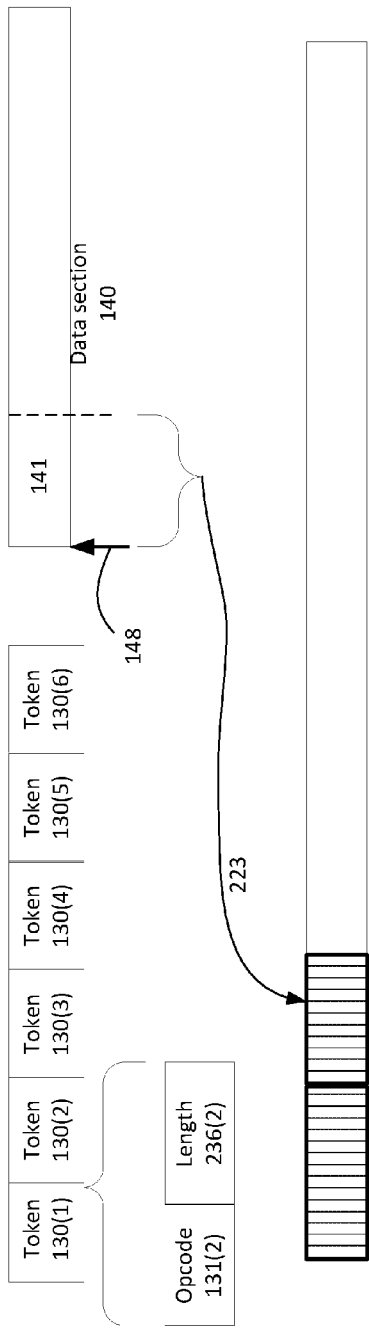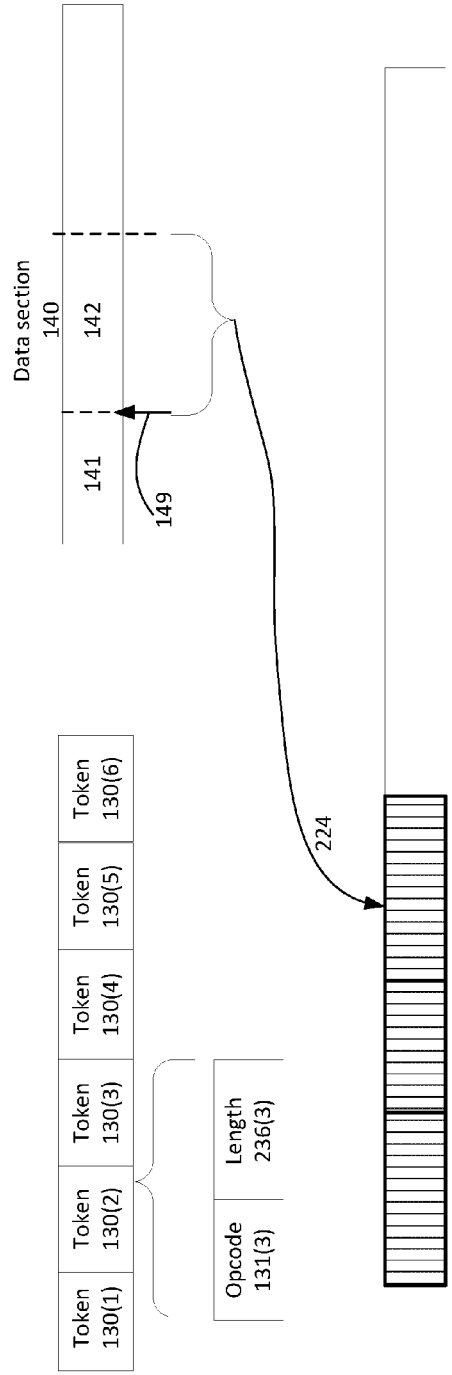

DECOMPRESSION OF A COMPRESSED DATA UNIT

BACKGROUND

The classical and most used lossless data compression algorithms are based on Lempel-Ziv (LZ) seminal papers from the 70s. LZ compression is based on dictionary coding, where the amount of data to be stored is reduced by replacing the data with dictionary references. The dictionary may be external to the data being coded or internal to the data. When the dictionary is external, then both the encoder and the decoder should have access to the same dictionary. An internal dictionary means that the content of the current decoded data may be used as a dynamic dictionary, also called "sliding window" dictionary. The current compression algorithms generate a stream of tokens that mixes references to entries in dictionaries and embedded data.

LZ compression forms the base for multiple implementation variants that differ in their dictionary complexity, encoding scheme, speed, memory resources yielding variant compression efficiency. The most popular variant corresponds to the sliding window approach that produces an encoded stream composed of interleaved combination of dictionary values (data values) and dictionary references (position and length).

SUMMARY

According to an embodiment of the invention there may be provided a method, device and non-transitory computer readable medium as included in the claims and/or the drawings and/or the specification.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 illustrates an uncompressed data unit, a compressed data unit, and a decompressed data unit according to an embodiment of the invention;

FIG. 3B illustrates multiple tokens and a data section of the compressed data unit and a decompression buffer according to an embodiment of the invention;

FIG. 3C illustrates multiple tokens and a data section of the compressed data unit and a decompression buffer according to an embodiment of the invention;

DETAILED DESCRIPTION OF THE DRAWINGS

Figure 2A:
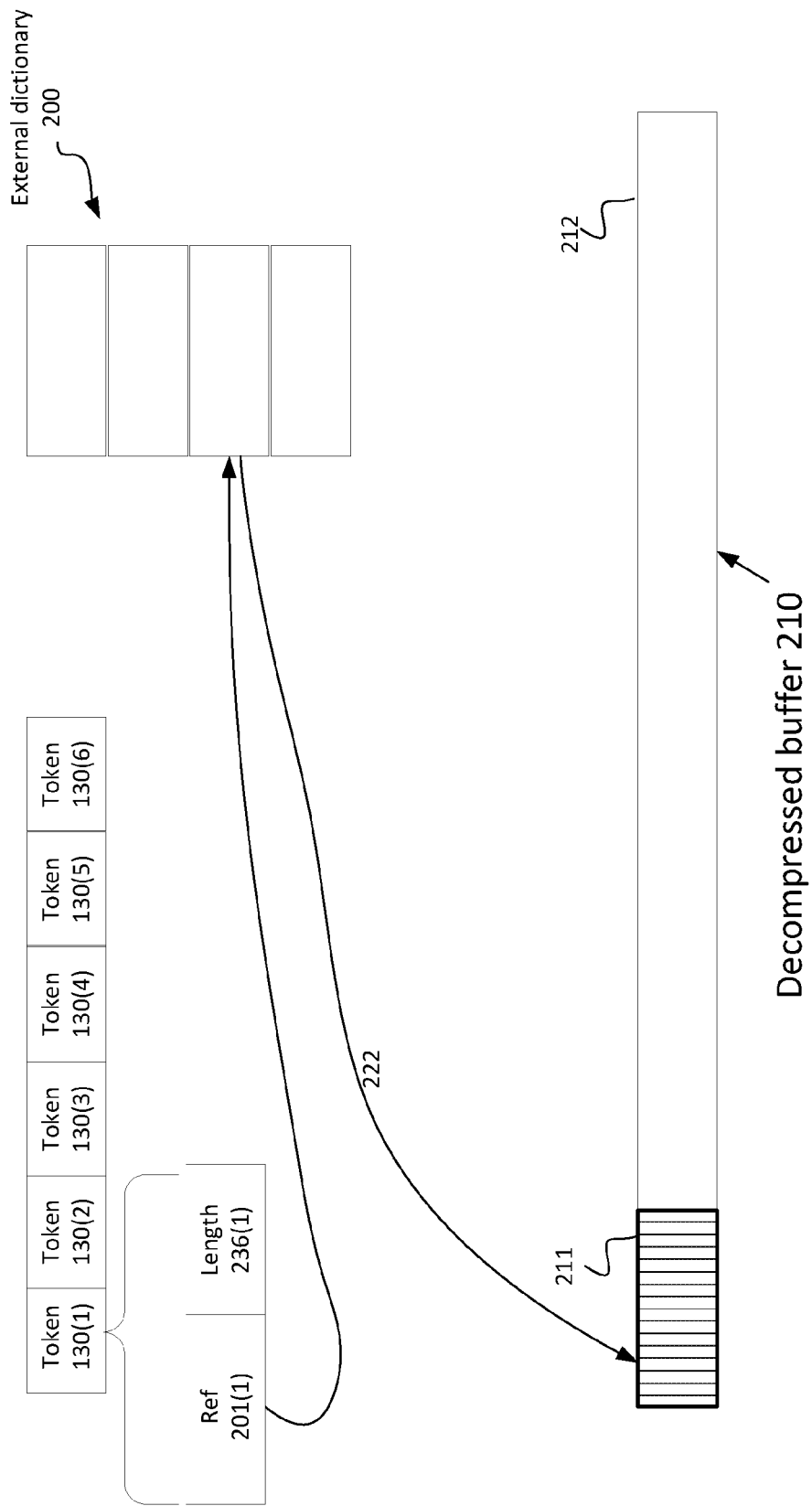
FIG. 2A illustrates multiple tokens of the compressed data unit, an external memory and a decompression buffer according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The system, non-transitory computer readable medium and method provide compression and decompression of data, wherein a compressed data unit is represented by two distinct elements: (i) a sequence of decompression instructions, also referred to as a sequence of control tokens; and (ii) data section, which may include: unique data/non-repeating data of the uncompressed data unit or a dictionary. The data section serves as a data source for copying portions of it into a decompression buffer, during the decompression process, as defined by the decompression instructions. Each of the decompression instructions is encapsulated in a control token that may include a reference to the data section. The control token can also include a reference to other data sources, such as: an external dictionary and a previous location within the decompression buffer itself. The control tokens include only control information, mainly various copy commands, and unlike other compression techniques, do not include any data, as any data required by the instructions is separate and kept in the data section. A sequence of control tokens of a compressed data unit includes multiple (at least two) tokens, which hold all the instructions required for decompressing the compressed data unit. The control tokens of the presently disclosed subject matter form a decompression script that can be provided to a third-party decompressor.

FIG. 1 illustrates an uncompressed data unit 110, which may be of a size of data units received by a storage system from an accessing entity (e.g., a client, a host, an external application) that utilizes the storage system for storing data, and/or may be of a size of all uncompressed data units handled by the storage system.

Compressed data unit 120 is produced by applying the compression method of the present invention on uncompressed data unit 110. Compressed data unit 120 is composed of two parts. A first part is data section 140, which includes for example, single occurrences of data portions that may appear in the uncompressed data unit one or more times, one or more dictionaries, or any other data that is used as a source for the copy instructions, though not all data sources are necessarily included in the data section. The second part is a sequence of tokens 130 of n tokens, 130(1)-130(n) that includes a sequence of n decompression instructions. The tokens may be of a fixed size, so as to facilitate the processing by an offload processor. Fixed size tokens can accelerate both compression and decompression rates and may facilitate parallel decompression of a compressed data unit by multiple processors, wherein each processor receives a portion of the control tokens.

Each token may include an opcode (such as opcode 131(1), that identifies the type of compression instruction and one or more parameters (such as parameters 132(1) of token 130(1)) that may vary among different instructions.

Parameters 132 are mainly references to the data source to be copied: the length (e.g., length 136(1) in token 130(1)) and the location of the source data. The location may be: a backwards offset to the decompression buffer (e.g., offset 135(1) in token 130(1)), an offset (or "current position") in data section 140, pointers to external dictionaries or other memories where the data resides, etc.

The sequence of decompression instructions can be handed to any decompressor, along with the data section (or a pointer to the data section), whether the decompressor resides within the storage system, or within the accessing entity that is coupled to the storage system. The decompressor may be a third party component, may be a component used for offloading the decompression, and may reside on a network adaptor card (NIC, Network Interface Card), either on the transmitting NIC or on the receiving NIC. The decompressor can use the sequence of decompression instructions for copying the data referred to by the instructions into a decompressed data unit 111, which is identical to uncompressed data unit 110, as the compression is lossless.

The compression algorithm builds the decompression instructions that may cover several scenarios encountered during the compression. FIGS. 2A-2F illustrates these scenarios and how the decompression instruction is interpreted by the decompressor. FIGS. 2A-2F illustrates a sequence of six control tokens 130(1)-130(6) of a compressed data unit. Decompression buffer 210 is used during the decompression process for storing the decompressed parts and will contain the entire decompressed data unit when the decompression is completed. The tokens 130 instruct to copy data from various sources: an external dictionary 200, the data section 140 of the compressed data unit and decompression buffer 210. The different instructions can be identified by an opcode (not shown) or alternatively, an instruction can be identified implicitly by the values of the parameters. For example, an offset of zero may indicate an instruction for copying a data portion from the current position in the data section or an offset that is out of the scope of the decompression buffer can indicate another data source (e.g., external dictionary). The first token in the sequence of tokens may represent the number of tokens and will include an offset to the data section, where the number of tokens is stored.

Copying data from a pre-defined external dictionary.

An external dictionary or a global dictionary may be a dictionary that serves more than one compression process of a single data unit. The external dictionary may serve the compression of: an entire volume, a specific area within a volume, a group of volumes (e.g., volumes that serves one application or one user) or the entire storage system. More than one external dictionary can be used. The external dictionary may be shared among several storage systems, for example, between a primary and secondary storage systems that conduct remote replication. The external dictionary may be also shared between the storage system and the accessing entity (e.g., host computer).

Using an external dictionary is efficient at the beginning of the compression, before the internal dictionary is built, and before any repetition is detected.

This instruction may include a pointer to the data in the external dictionary, which may reside anywhere in the storage system or an offset within the external dictionary (assuming its start address is known). The instruction may further include the length to be copied and an identity of the dictionary, in a case where more than one directory is being used.

FIG. 2A illustrates a first stage of a decompression process that executes the decompression instruction embedded in the first control token 130(1).

Control token 130(1) instructs to copy from an external dictionary 200. Control token 130(1) includes: (i) a reference 201(1) indicative of the position within external dictionary 200 (a pointer or offset from the start of the dictionary) and optionally—the identity of the dictionary, if more than one dictionary is used; and (ii) length 236(1) that indicates the length of the data to be copied.

Figure 3A:
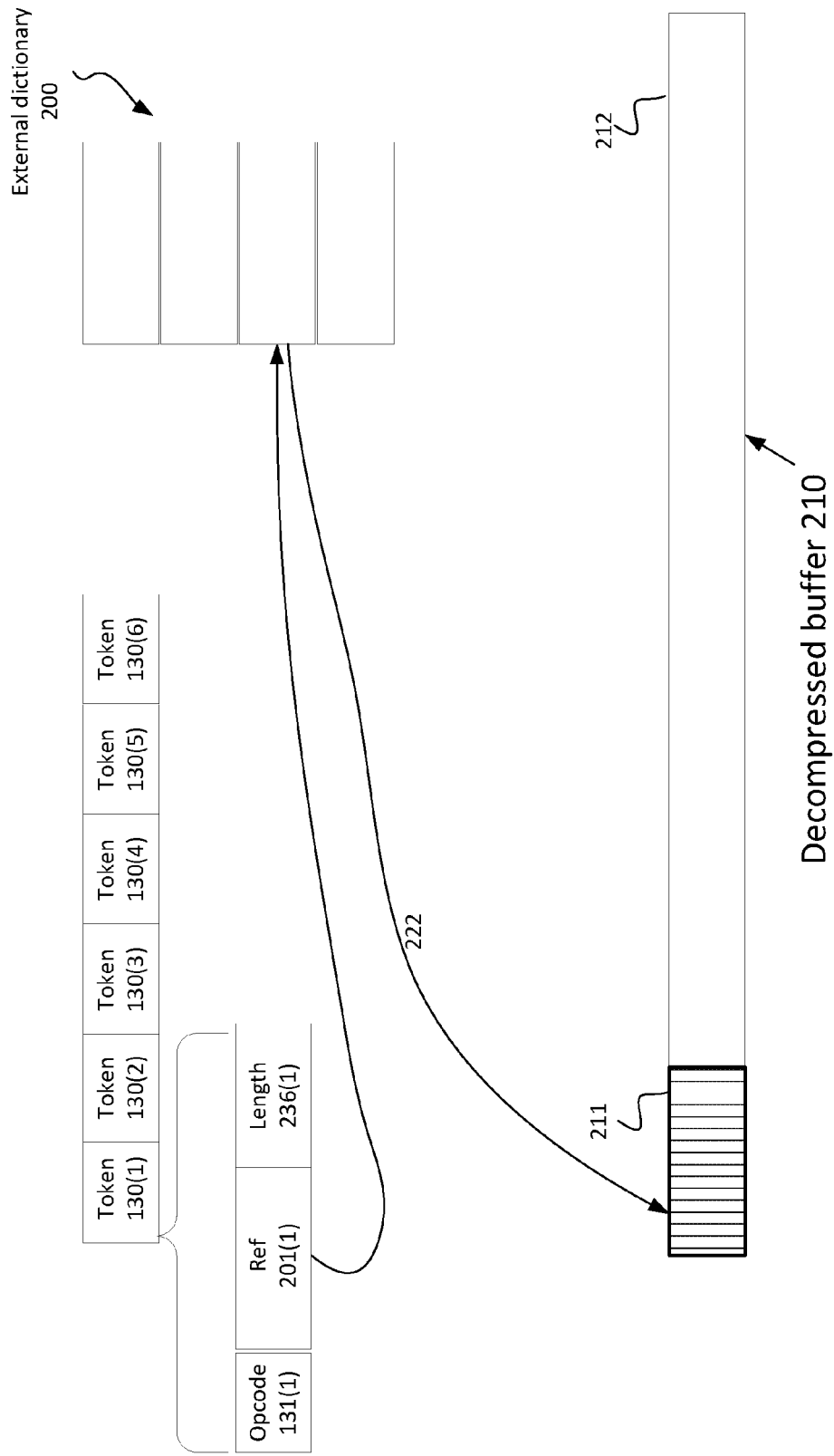
FIG. 3A illustrates multiple tokens of the compressed data unit, an external memory and a decompression buffer according to an embodiment of the invention.

In FIG. 3A first control token 130(1) also include opcode 131(1).

The content of the referred area is copied (as indicated by arrow 222) to the beginning of a decompression buffer 210 and occupies a space. The rest of decompression buffer 210, i.e., space 212 is still empty at this stage.

When a remote replication is activated between the storage system and another storage system, the external dictionary can be communicated between the systems, for example, whenever a change in the dictionary occurs. The replication cycles can send only the compressed data units, with references to the global dictionary, without needing to replicate the dictionary entries.

Copying data from the data section.

Figure 2B:
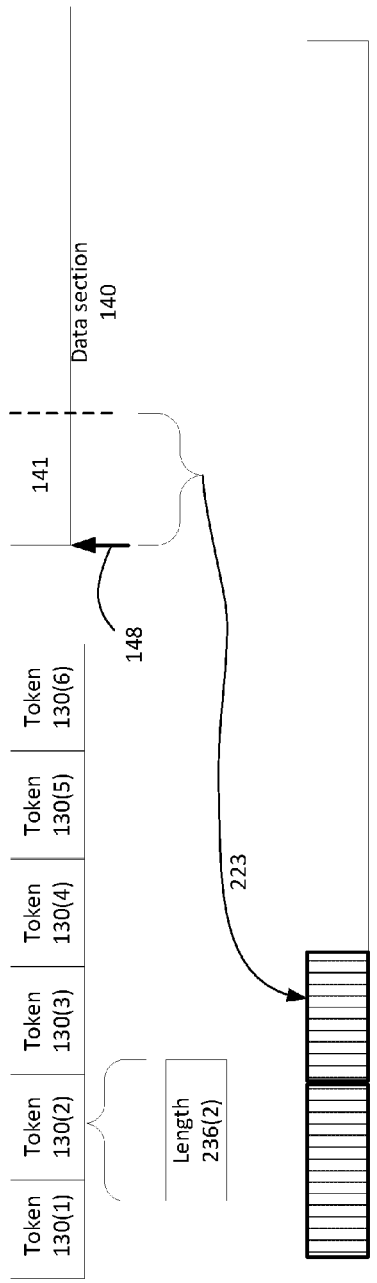
FIG. 2B illustrates multiple tokens and a data section of the compressed data unit and a decompression buffer according to an embodiment of the invention.

This instruction embedded in second control token 130(2) of FIGS. 2B and 3B instructs copying a data portion 141 from the data section 140.

In FIG. 2B second control token 130(2) specifies the length 236(2) of data portion 141 to be copied from the data section. In FIG. 3B the second control token 130(2) also includes opcode 131(2).

The offset of the data portion within the data section is assumed as the current position, as indicated by arrow 148. Since this is the first time a copy is performed from the data section, arrow 148 indicates a current position that is at the beginning of the data section. During the decompression process, data portion 141 is copied (as indicated by arrow 223) from the data section to the next empty space in decompression buffer 210 and the current position in the data section is updated so as to point to a position after the copied data portion, as indicated by arrow 149 of FIG. 2C.

Figure 2C:
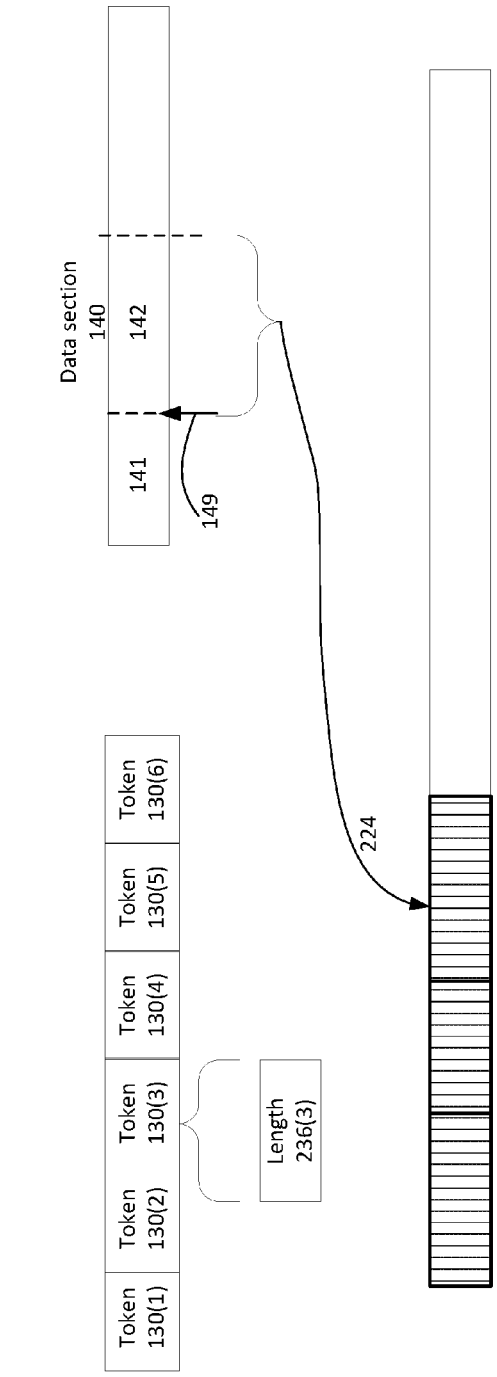
FIG. 2C illustrates multiple tokens and a data section of the compressed data unit and a decompression buffer according to an embodiment of the invention.

FIG. 2C illustrates third control token 130(3) as instructing copying the next data portion (142) from the data section 140. The offset is the current position within the data section, as indicated by arrow 149 and the length is 236(3).

In FIG. 3C the third control token also includes opcode 131(3).

Copying data from the decompression buffer using a backwards offset.

This instruction will be generated when the compression of the data unit is progressed and duplication of data portions can already be identified in the already decompressed part of decompression buffer 210.

Figure 2D:
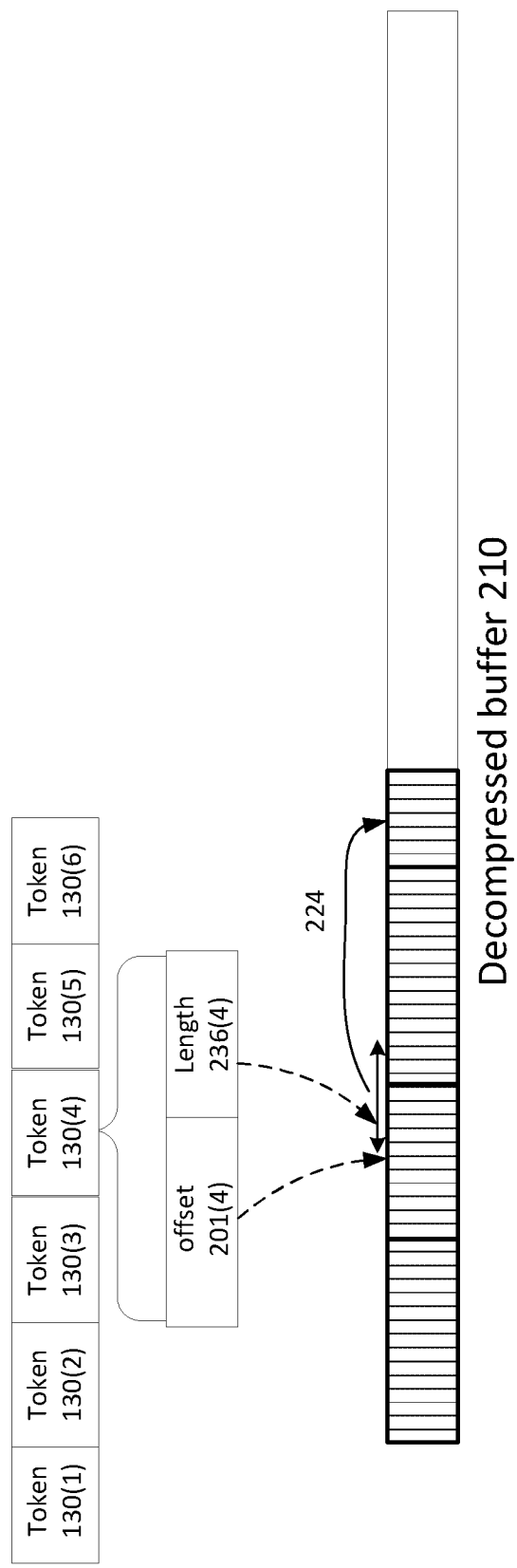
FIG. 2D illustrates multiple tokens and a decompression buffer according to an embodiment of the invention.

FIG. 2D illustrates fourth control token 130(4) as including an offset 201(4) (either backwards, relative to the current location or from the start of the buffer) within the decompression buffer and the length 236(4) of the data portion to be copied (224) from the previous location in the decompression buffer, into the current location in the decompression buffer.

Figure 3D:
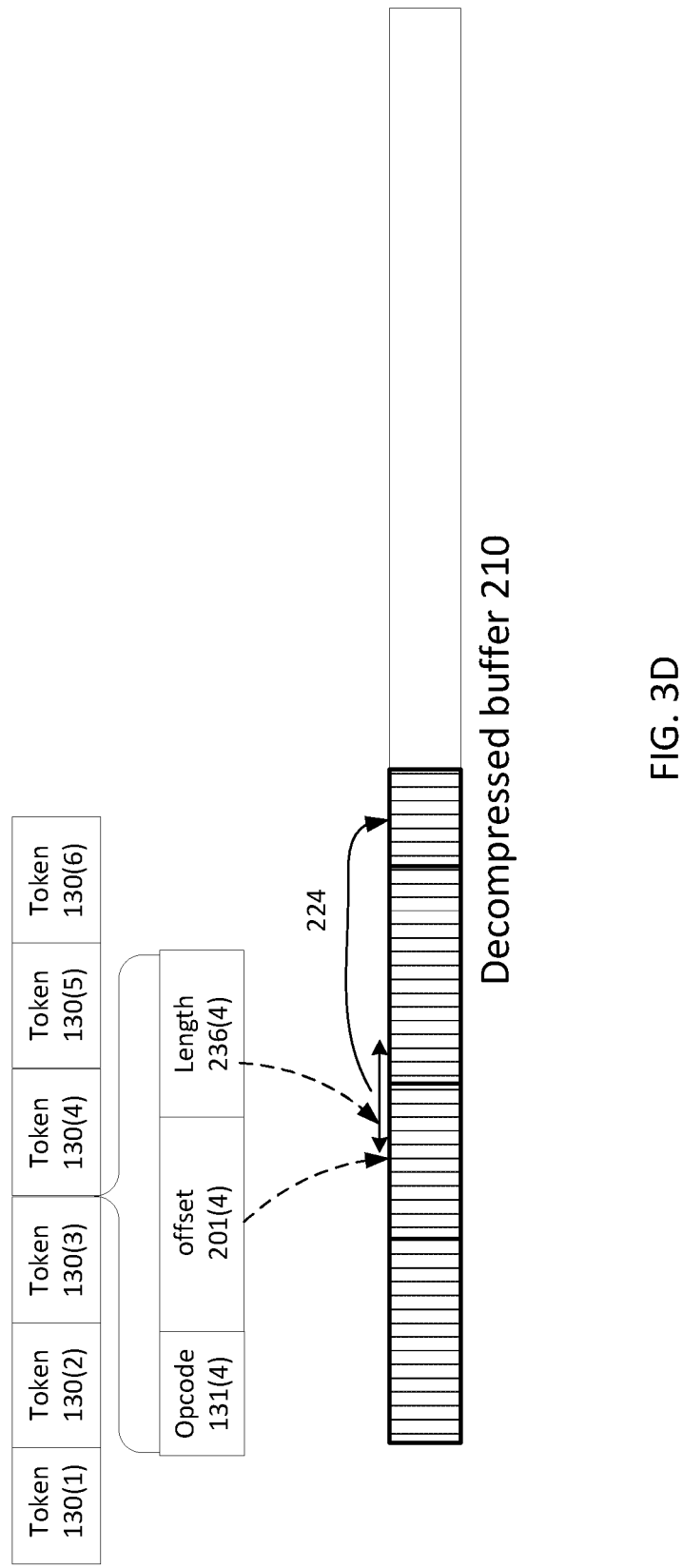
FIG. 3D illustrates multiple tokens and a decompression buffer according to an embodiment of the invention.

In FIG. 3D the fourth control token also includes opcode 131(4).

Note that compression algorithms used today implement either the external dictionary of scenario 1, or the internal dictionary of scenario 3. Providing the option to use a combination of both approaches will improve the compression ratio, as the external dictionary is more efficient at the beginning of the data unit compression and the internal dictionary becomes efficient as the compression progress.

Run-length encoding.

This instruction is used when the same data value is repeated in the original uncompressed data unit multiple times. The data portion 143 to be repeated starts at the current position of the data section.

Figure 3E:
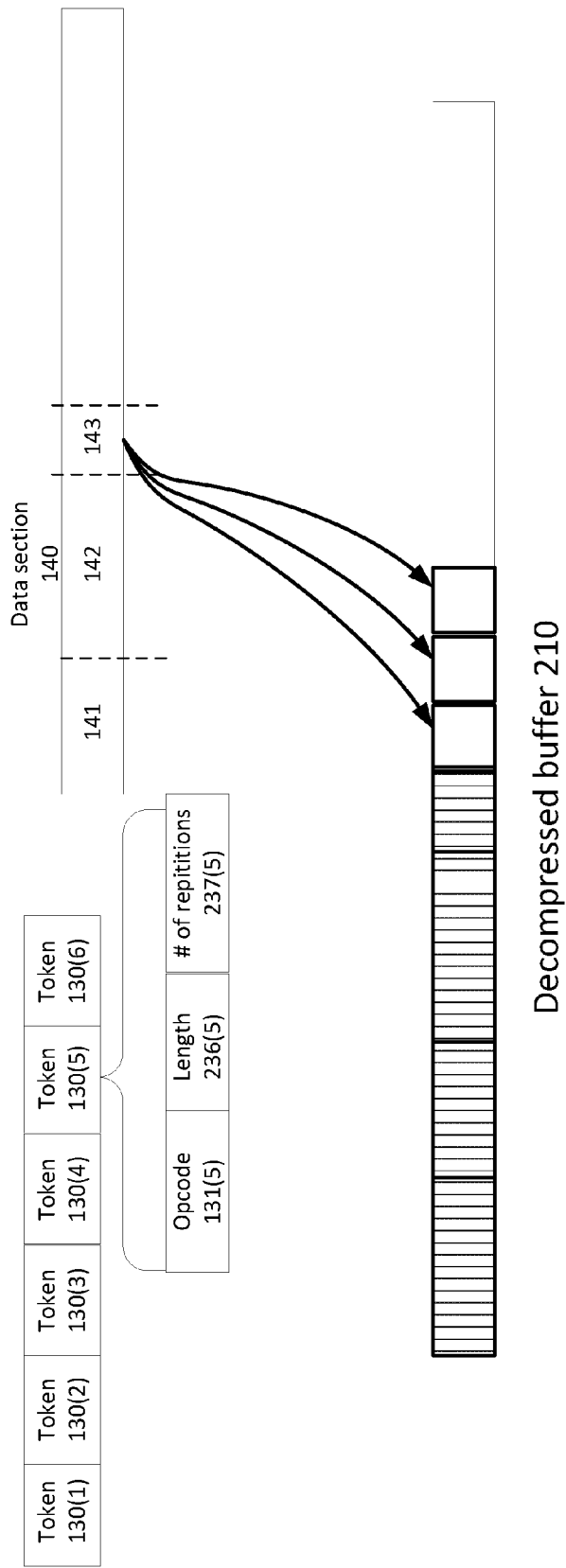
FIG. 3E illustrates multiple tokens and a data section of the compressed data unit and a decompression buffer according to an embodiment of the invention.

Fifth control token 130(5) of FIG. 3E illustrates the instruction as including: a length of the data portion 236(5) (optional, the value may be of a predefined size, e.g. 8 bytes, 2 integers, etc.) and the number of repetitions to be performed 237(5).

FIG. 3E illustrates data portion 143 as being copied three times in a row into decompression buffer 210. The number of repetitions can be much larger than three. For example, the entire data unit of 64 KB may be composed of the same value, so the repetitions may cover the entire decompression buffer. Alternatively, data portion 143 can be copied only once from the data section and then copied twice (the number of repetitions minus one) from the decompression buffer using a backwards offset.

In FIG. 3E the fifth control token also includes opcode 131(5).

Abort compression.

During the compression, a monitoring of the compression can be made for evaluating the efficiency of the ongoing compression. If it is determined that the compression being computed for a specific data unit is not efficient, for example: the compression ratio is too low, or the compression consumes too much computing (or other) resources or takes too much time, the compression can be aborted, but without losing the already compressed part of the data unit. In this case, the already compressed part will not be removed from the compressed buffer (sequence of tokens and data section). The remaining part of the original (uncompressed) data unit, which has not been compressed, will be added in its entirety to the data section and a new token (such as token 130(6)) will be added to the sequence of tokens for describing the abortion, e.g., the new token indicates to copy the non-compressed part to the decompression buffer. The instruction embedded in the new token may only include an opcode that indicates to copy the remaining of the data section starting from the current position. There is no need to indicate the length, as the length is the length of the remaining data unit. For example, if the size of an uncompressed data unit is 64 KB and the compression was aborted after processing 10 KB of uncompressed data, then the length to be copied is 54 KB.

Figure 2E:
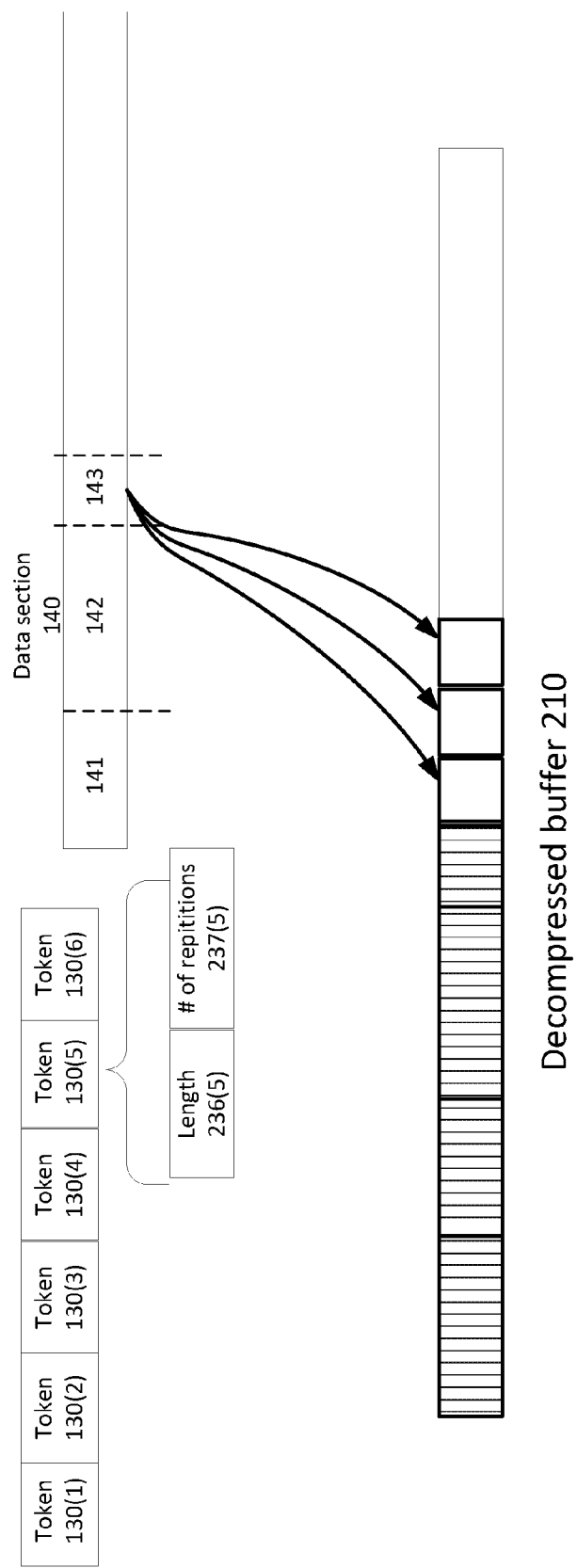
FIG. 2E illustrates multiple tokens and a data section of the compressed data unit and a decompression buffer according to an embodiment of the invention.
Figure 2F:
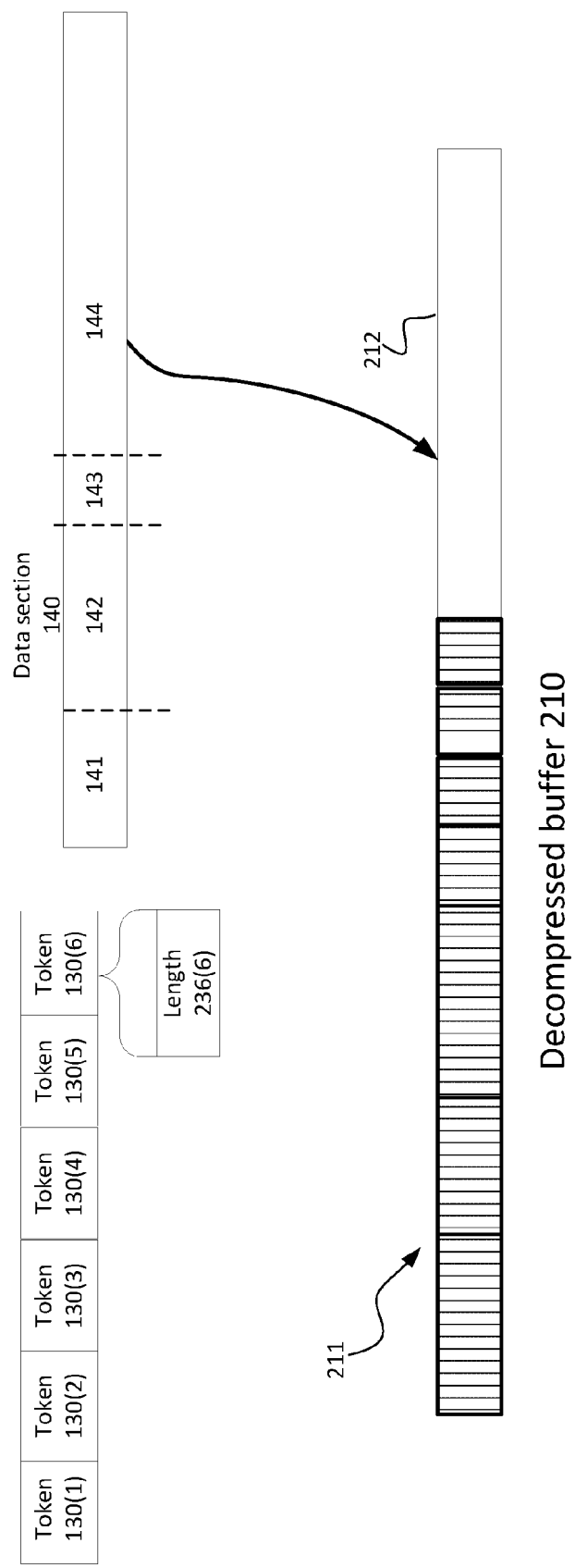
FIG. 2F illustrates multiple tokens and a data section of the compressed data unit and a decompression buffer according to an embodiment of the invention.

FIG. 2F illustrates a sixth control token 130(6) that represents a case of aborted compression and instructs to copy the entirety of the data section. Decompression buffer 210 is partially full (211) and partially empty (212), since the decompression has not been completed yet. Suppose the size of data units in the system is 64 KB and so is the length of decompression buffer 210, the size to be copied is the size of empty part 212, or can be calculated by subtracting the length of the full part 211 of decompression buffer from the data unit size of 64K. The decompression process copies the rest of the data section (data portion 144) starting from the current position in the data section into the empty part 212.

Figure 3F:
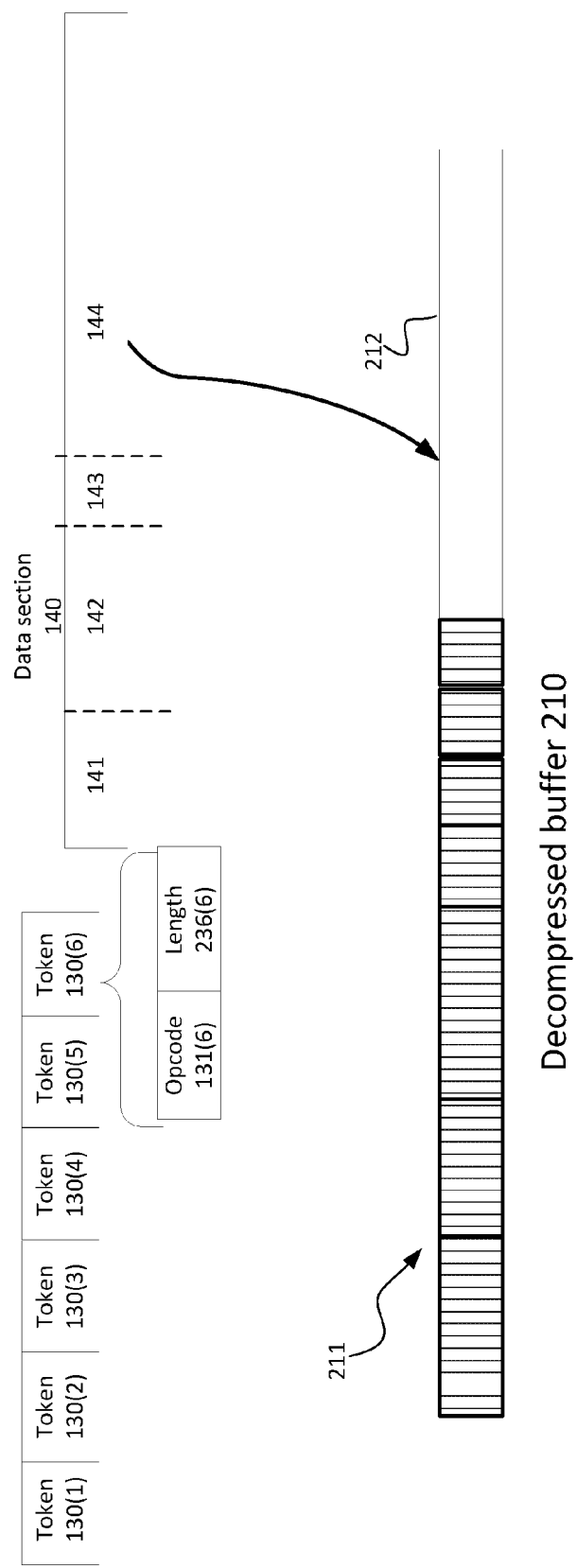
FIG. 3F illustrates multiple tokens and a data section of the compressed data unit and a decompression buffer according to an embodiment of the invention.

In FIG. 3F the sixth control token also includes opcode 131(6).

Using deduplicated data.

In a case where it is detected that the data unit to be compressed is a deduplicated data unit, i.e., identical to another data unit stored in the system, this instruction is used to point to that data unit. The data may be stored anywhere in the system, outside of the data section, in any memory or storage of the storage system. The instruction may include a reference to the deduplicated data unit, such as a pointer or a hash value indicative of the content of the deduplicated data unit. The pointer may point to a cache memory where the deduplicated data can be found or to another storage media, such as SSD. When a remote replication is activated between the storage system and another storage system, and both systems handles dedupliction in a similar manner, then the compressed data unit with the reference to the deduplicated data unit can be sent without needing to copy the deduplicated data unit.

Since the methods of the presently disclosed subject matter extract any data from the tokens, it is likely that many of the tokens of a compressed data unit are identical. In contrast to pure data, which is generally characterized by high diversity, pure instructions are repetitive and are likely to share high similarity among them. Specifically, the instructions for copying data from the data section has only one parameter, the length, as the offset is assumed to be "the current position" and can be omitted or set to zero. It is likely that many of the length values will be equal and therefore multiple tokens that include instructions for "copying data from the data section" will be identical.

Other instructions, such as "copying data from the decompressed buffer", having two parameters (backwards offset and length) also have high potential for similarity. Therefore, using the compression of the presently disclosed subject matter will result compressed data units that are composed of repeating tokens. A second pass can be extremely effective, as it will eliminate duplicated tokens. In the second pass of compression, the tokens generated in the first round, are treated as the input for compression, in the same manner as the first pass treats the uncompressed data, i.e., by separating the tokens into two parts: second level tokens and a second level data section. The second level data section includes unique first level tokens, i.e., one appearance of each unique token's content. The second level tokens include instructions for copying from the second level data section.

Figure 4:
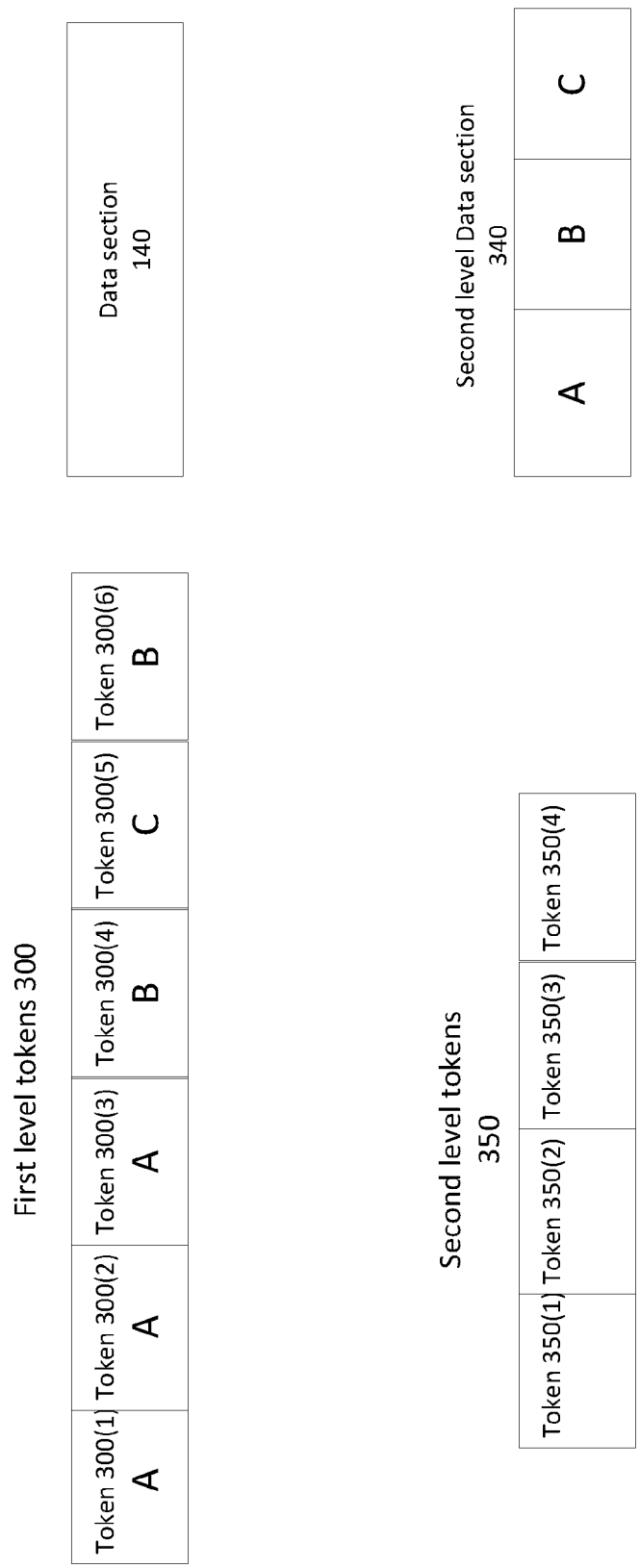
FIG. 4 illustrates first level tokens, second level tokens, first level data section and second level data section of the compressed data unit and a decompression buffer according to an embodiment of the invention.

FIG. 4 illustrates data section 140 (also referred to as first level data section) and first level tokens 300, wherein some of the tokens have identical content. The first three tokens 300(1)-300(3) share identical content represented by "A", tokens 300(4) and 300(6) share identical content represented by "B" and token 300(5) has a content represented by "C". The second pass generates second level tokens 350 and a second level data section 340. Second level data section 340 includes one instance of the different contents of the first level tokens, i.e., content "A", content "B" and content "C".

Second level token 350(1) includes an instruction for run-length decoding, i.e., copy the content ("A") from the current position (1) in the second level data section 340 and repeat the content three times. Second level token 350(2) includes an instruction for copying the content ("B") from the current position (2) in the second level data section 340. Second level token 350(3) includes an instruction for copying the content ("C") from the current position (3) in the second level data section 340. Second level token 350(4) includes an instruction for copying data from the decompressed buffer from offset 2 behind.

The decompression process will use the second level data section and the second level tokens, so as to generate the first level tokens and then use the generated first level tokens and first level data section, so as to provide the decompressed data unit.

Figure 5A:
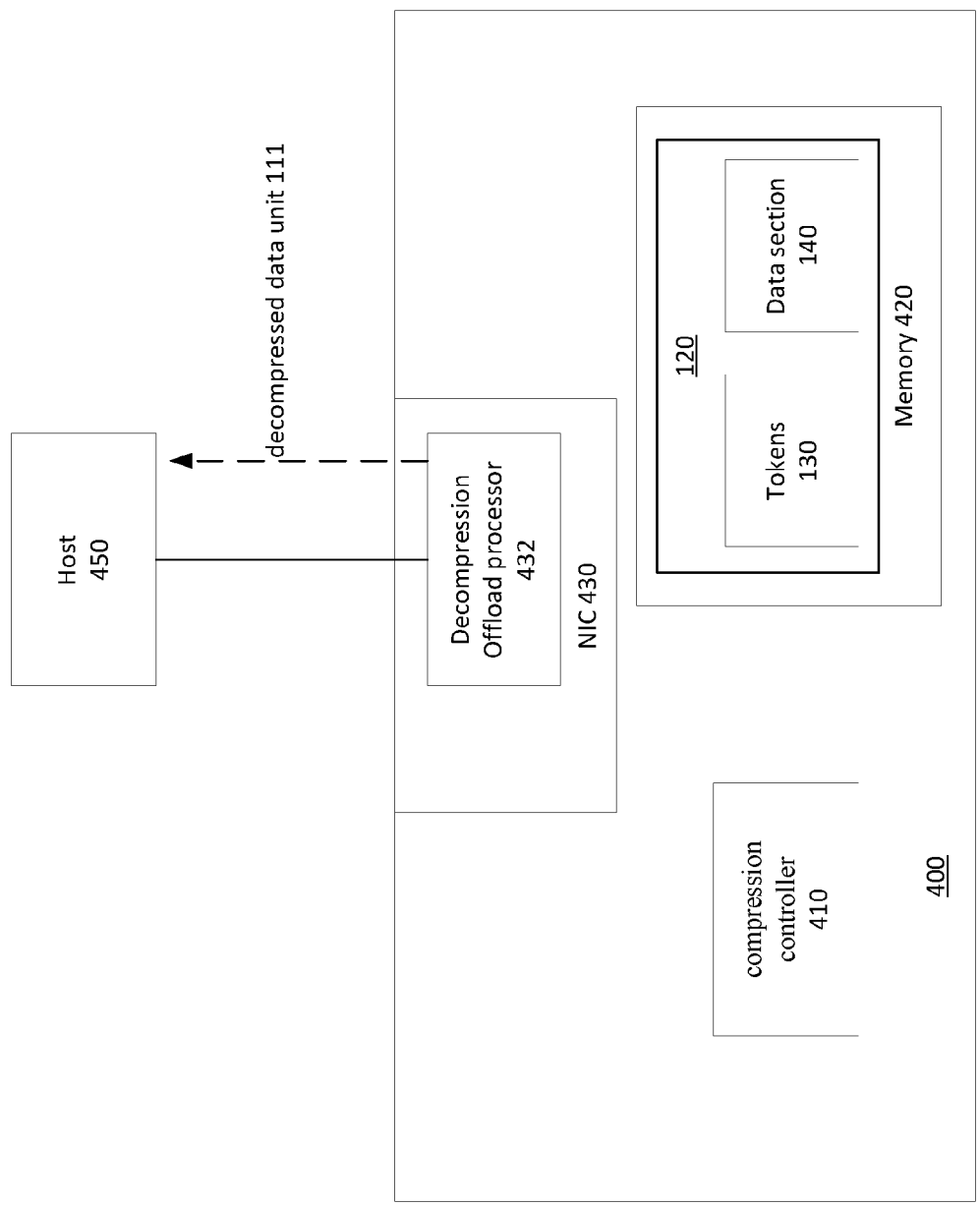
FIG. 5A illustrates a system according to an embodiment of the invention.

FIG. 5A illustrates a storage system 400 and a host 450 coupled over the network. Host 450 sends read and write requests towards storage system 400. Storage system 400 includes one or more processors. At least one of processors is a compression controller 410 that compresses the data that is written to storage system upon write requests from host 450. The data is stored in its compressed form. Memory 420 stores compressed data units such as a compressed data unit 120 that is composed of a sequence of tokens 130 and data section 140. Compressed data unit 120 may be further stored in a permanent storage, e.g., SSD or a disk drive. The sequence of tokens 130 may be stored in a memory or a storage system that differs from a memory or storage system that stores data section 140.

Upon receiving a read request from the host, the sequence of tokens 130 is handed to the decompression offload processor 432. Decompression offload processor 432 may be part of a NIC 430, so the decompression is being executed as part of the transmission process handled by the NIC. Decompression offload processor 432 interprets the sequence of instructions provided in tokens 130 and copy the data referred to by each token, so as to construct decompressed data unit 111. Tokens 130 may be read into the internal cache of offload processor 432. A DMA may be used for the copy operations. The decompressed data unit 111 is then sent to host 450.

Figure 5B:
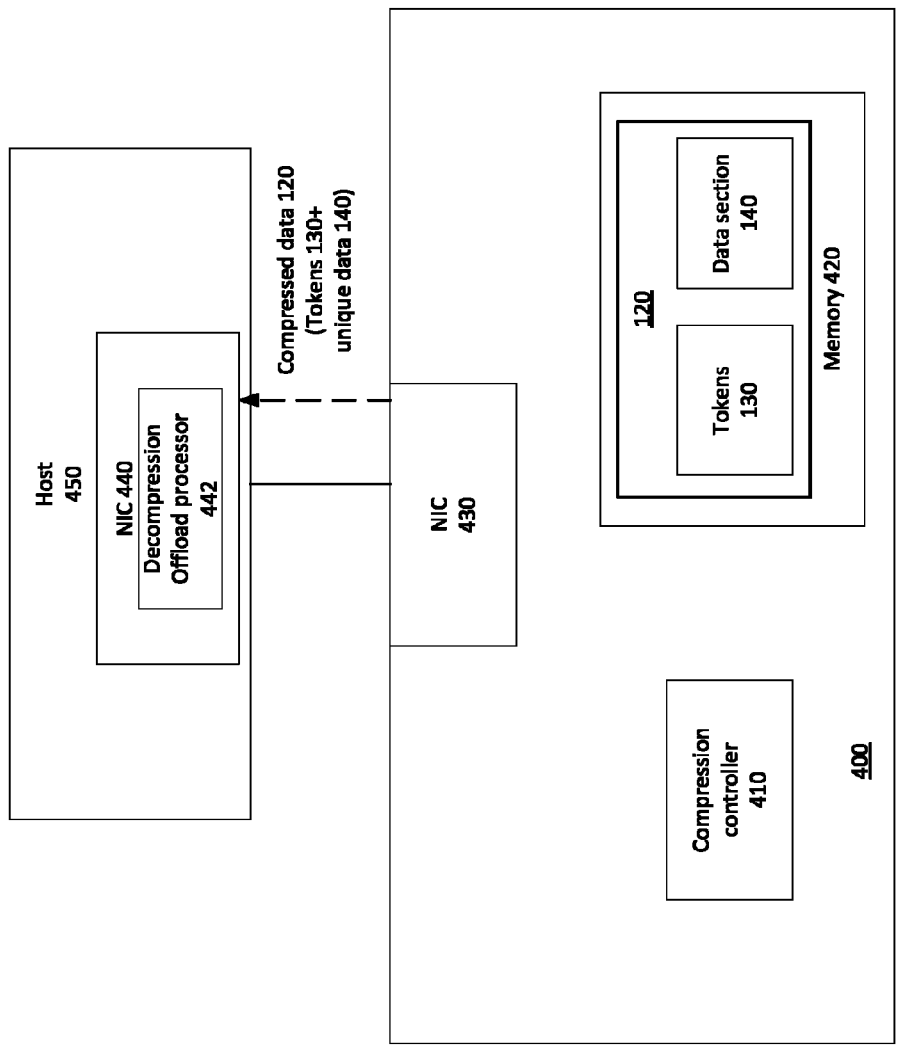
FIG. 5B illustrates a system according to an embodiment of the invention.

FIG. 5B illustrates the same storage system, but instead of sending decompressed data to the host, the data is sent to host 450 in its compressed form, i.e., a compressed data unit 120 that is composed of tokens 130 and data section 140. Thus, network bandwidth is spared. Upon receiving the compressed data unit 120 by NIC 440 of the host, a decompression offload processor 442 of the NIC (or any other offload processor) uses tokens 130 and data section 140 for the decompression and then hands the decompressed data unit to the application that requested the data.

Figure 6:
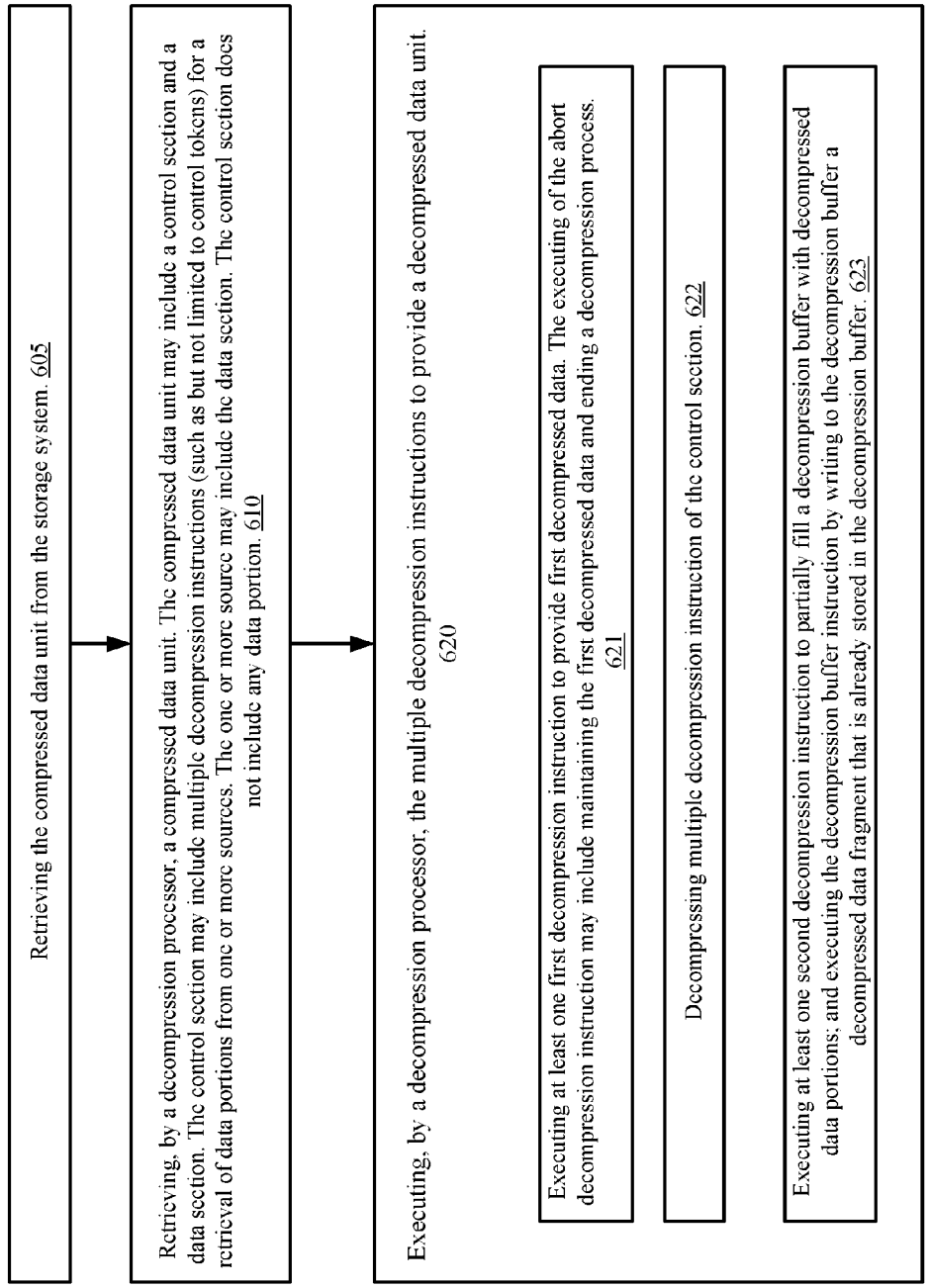
FIG. 6 illustrates a method according to an embodiment of the invention.

FIG. 6 illustrates method 600 according to an embodiment of the invention.

Method 600 is for decompressing a compressed data unit. Method 600 may be executed by storage system 400 or by host computer 450 or by any computerized system such as but not limited to a computer, a desktop computer, a laptop computer, a mobile device, a smartphone, a media player, and the like.

Method 600 may start by step 610 of retrieving, by a decompression processor (such as decompression offload processor 432/442), a compressed data unit. The compressed data unit may include a control section and a data section. The control section may include multiple decompression instructions (such as but not limited to control tokens) for a retrieval of data portions from one or more sources. The one or more source may include the data section. The control section does not include any data portion.

Step 610 may be followed by step 620 of executing, by the decompression processor, the multiple decompression instructions to provide a decompressed data unit. The executing of each decompression instruction may include retrieving a data portion from a source that is indicated by the decompression instruction and copying the data portion into the decompression buffer. The decompressed data unit is composed of data that was copied from various sources according to the various decompression instructions.

The data section may store single instances of data portions and does not store multiple instances of the data portions; wherein each data portion of the data portions includes at least two bytes.

The decompression instructions may include at least one first decompression instruction that is followed by an abort decompression instruction. In this case (see, for example, FIGS. 2F and 3F) step 620 may include executing (621) the at least one first decompression instruction to provide first decompressed data. The executing of the abort decompression instruction may include maintaining the first decompressed data and ending a decompression process. Step 620 may include maintaining a segment of the data section that was not accessed during the executing of the at least one first decompression instruction. The first decompressed data and the segment of the data section may form the decompressed data unit. Step 620 may include copying the segment of the data section to the decompression buffer, after the first decompressed data.

The executing of the at least one first decompression instruction may include reaching a first point of the data section (for example—the end of data portion 143). Step 620 may include maintaining a segment (for example—data portion 144) of the data section that follows the first point.

The compressed data unit may include decompression instructions in a compressed form (see—for example—FIG. 4) and wherein an execution of each decompression instruction is preceded by decompressing (622) the multiple decompression instructions of the control section.

The multiple decompression instructions of the control section may be first level decompression instructions (for example—first level tokens 300); wherein the compressed data unit may include a set (for example—second level data section 340) of single instances of decompression instructions of the first level decompression instructions and second decompression instructions (for example—second level tokens 350) for generating the first level decompression instructions based on the single instances of the decompression instructions.

According to various embodiments of the invention the one or more sources (that may be referred to by the compressed data units) may include (see FIGS. 2A-2F and 3A-3F) at least one of the following—the data section, an external dictionary and a decompression buffer that stores the decompressed data unit. The dictionary is external in the sense that it is not a part of the compressed data unit and it is not the decompression buffer. The external dictionary may be stored within the device that executes method 600 or outside the device.

The control section may include a decompression buffer instruction that is preceded by at least one second decompression instruction. Step 620 may include (623) executing the at least one second decompression instruction to partially fill a decompression buffer with decompressed data portions; and executing the decompression buffer instruction by writing to the decompression buffer a decompressed data fragment that is already stored in the decompression buffer.

The decompression buffer instruction may be indicative of an offset that was already written to, within the decompression buffer, such as a backward pointer that points to the decompressed data fragment (see—for example—FIGS. 2D and 3D).

At least one decompression instruction is indicative of a repetition parameter that indicates a number of times a data portion should be consecutively written to a decompression buffer (see—for example—FIGS. 2E and 3E).

The decompression processor may be located in a host computer that is coupled to a storage system and step 610 of retrieving, by the decompression processor of the multiple decompression instructions may be preceded by (step 605 of) retrieving the compressed data unit from the storage system. The decompression processor may be otherwise located in a network interface controller (NIC) of the storage system used for transmitting decompressed data units or in another offload module in the storage system, and step 610 of retrieving, by the decompression processor of the multiple decompression instructions may be preceded by (step 605 of) retrieving the compressed data unit from an application that is executed in the storage system.

Step 605 may be initiated by a network interface controller coupled to the storage system.

The decompression processor may be a part of a network interface controller of the storage system or may be a part of a network interface controller coupled to the storage system.

Step 620 may include utilizing all the data section or only a part of the data section.

Figure 7:
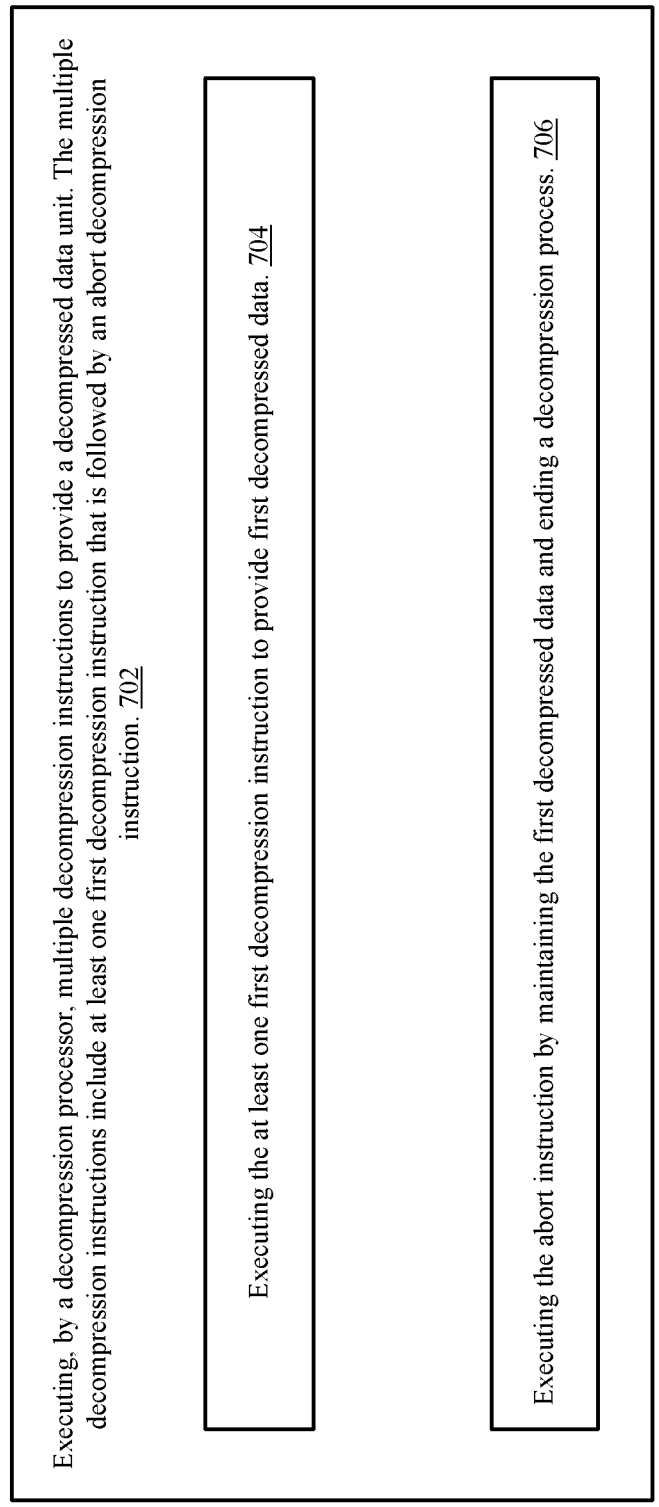
FIG. 7 illustrates a method according to an embodiment of the invention.

FIG. 7 illustrates method 700 according to an embodiment of the invention.

Method 700 may start by step 702 of executing, by a decompression processor, multiple decompression instructions to provide a decompressed data unit. The multiple decompression instructions include at least one first decompression instruction that is followed by an abort decompression instruction.

Step 702 may include step 704 of executing the at least one first decompression instruction to provide first decompressed data, and step 706 of executing the abort instruction by maintaining the first decompressed data and ending a decompression process. Step 706 may include copying the segment of the data section to the decompression buffer, after the first decompressed data.

Figure 8:
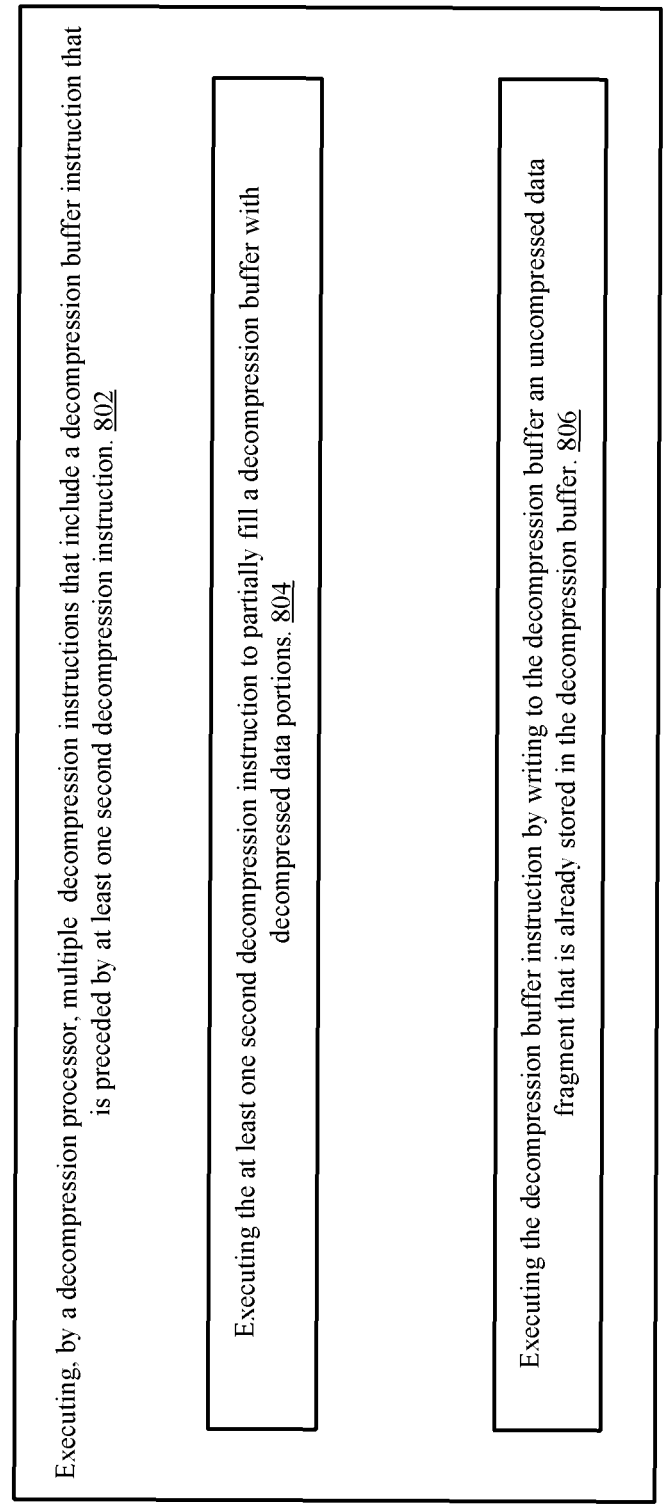
FIG. 8 illustrates a method according to an embodiment of the invention.

FIG. 8 illustrates method 800 according to an embodiment of the invention.

Method 800 may start by step 802 of executing, by a decompression processor, multiple decompression instructions that include a decompression buffer instruction that is preceded by at least one second decompression instruction.

Step 802 may include step 804 of executing the at least one second decompression instruction to partially fill a decompression buffer with decompressed data portions, and step 806 of executing the decompression buffer instruction by writing to the decompression buffer an uncompressed data fragment that is already stored in the decompression buffer.

Figure 9:
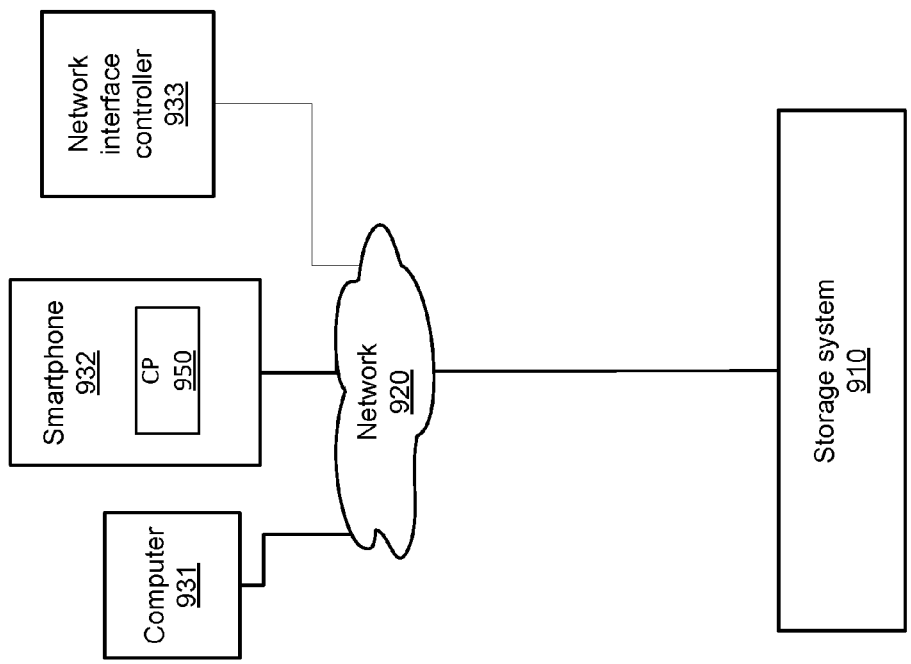
FIG. 9 illustrates a storage system, a network and various devices that are coupled to the network according to an embodiment of the invention.

FIG. 9 illustrates storage system 910, network 920, host computer 931, smartphone 932 and network interface controller 933 according to an embodiment of the invention.

Network 920 is coupled to storage system 910, host computer 931, smartphone 932 and network interface controller 933. The storage system 910 may be, for example, a massive storage system—a storage system that mays tore more than 500 Terabytes of information.

Host computer 931, smartphone 932 and network interface controller 933 are merely non-limiting examples of devices that may execute either one of methods 600, 700 and 800. Each one of these devices may or may not be coupled to storage system 910.

Host computer 931, smartphone 932 and network interface controller 933 may include the decompression processor and/or memory for storing the compressed data unit and/or the decompression buffer. For example—FIG. 9 illustrates a compression processor (CP) within smartphone 932.

The external memory may be located the storage system 910, in host computer 931, smartphone 932 and/in network interface controller 933. The compression processor may be a dedicated hardware accelerator, a general purpose processor the is configured to execute various instructions, code, software, firmware, middleware, microcode and the like in order to execute either one of methods 600, 700 and 800.

The external dictionary may be shared between storage system 910, host computer 931, smartphone 932 and network interface controller 933.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for decompressing a compressed data unit, the method comprises:
   retrieving, by a decompression processor, a compressed data unit; wherein the compressed data unit comprises a control section and a data section; wherein the control section comprises multiple decompression instructions for a retrieval of data portions from one or more sources; wherein the one or more sources comprise the data section; wherein the control section does not include any data portion; and
   executing, by a decompression processor, the multiple decompression instructions to provide a decompressed data unit.

2. The method according to claim 1 wherein the data section stores single instances of data portions and does not store multiple instances of the data portions; and wherein each data portion of the data portions includes at least two bytes.

3. The method according to claim 1, wherein the decompression instructions comprise at least one first decompression instruction that is followed by an abort decompression instruction;
   wherein the executing of the multiple decompression instructions comprises:
   executing the at least one first decompression instruction to provide first decompressed data; and
   wherein the executing of the abort decompression instruction comprises maintaining the first decompressed data and ending a decompression process.

4. The method according to claim 3, wherein the executing of the abort decompression instruction further comprising maintaining a segment of the data section that was not accessed during the executing of the at least one first decompression instruction.

5. The method according to claim 4 wherein the first decompressed data and the segment of the data section form the decompressed data unit.

6. The method according to claim 3, wherein the executing of the at least one first decompression instruction comprises reaching a first point of the data section; and wherein the executing of the abort decompression instruction further comprising maintaining a segment of the data section that follows the first point.

7. The method according to claim 1, wherein the compressed data unit comprises decompression instructions in a compressed form and wherein an execution of each decompression instruction is preceded by decompressing the multiple decompression instructions of the control section.

8. The method according to claim 1, wherein the multiple decompression instructions of the control section are first level decompression instructions; and wherein the compressed data unit comprises a set of single instances of decompression instructions of the first level decompression instructions and second level decompression instructions for generating the first level decompression instructions based on the single instances of the decompression instructions.

9. The method according to claim 1 wherein the one or more sources comprise the data section, an external dictionary and a decompression buffer that stores the decompressed data unit.

10. The method according to claim 1 wherein the control section comprises a decompression buffer instruction that is preceded by at least one second decompression instruction; wherein the executing of the multiple decompression instructions comprises: executing the at least one second decompression instruction to partially fill a decompression buffer with decompressed data portions; and executing the decompression buffer instruction by writing to the decompression buffer a decompressed data fragment that is already stored in the decompression buffer.

11. The method according to claim 10, wherein the decompression buffer instruction comprises a backward pointer that points to the decompressed data fragment.

12. The method according to claim 1, wherein at least one decompression instruction is indicative of a repetition parameter that indicates a number of times a data portion should be consecutively written to a decompression buffer.

13. The method according to claim 1 wherein the decompression processor is located in a host computer that is coupled to a storage system and wherein the retrieving, by the decompression processor of the multiple decompression instructions is preceded by retrieving the compressed data unit from the storage system.

14. The method according to claim 13 wherein the retrieving of the compressed data unit from the storage system is initiated by a network interface controller coupled to the storage system.

15. The method according to claim 1 wherein the decompression processor is a part of a network interface controller of the storage system.

16. The method according to claim 1 wherein the executing comprises utilizing all the data section.

17. A non-transitory computer readable medium that stores instructions that once executed by a storage system cause the storage system to execute the steps of: retrieving, by a decompression processor, a compressed data unit; wherein the compressed data unit comprises a control section and a data section; wherein the control section comprises multiple decompression instructions for a retrieval of data portions from one or more sources; wherein the one or more source comprise the data section; wherein the control section does not include any data portion; and executing, by a decompression processor, the multiple decompression instructions to provide a decompressed data unit.

* * * * *